United States Patent
You

(10) Patent No.: US 9,625,558 B2
(45) Date of Patent: Apr. 18, 2017

(54) DUPLEX SYSTEM

(71) Applicant: LSIS CO., LTD., Anyang-si, Gyeonggi-do (KR)

(72) Inventor: Chang Sung You, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/636,972

(22) Filed: Mar. 3, 2015

(65) Prior Publication Data

US 2015/0260822 A1 Sep. 17, 2015

(30) Foreign Application Priority Data

Mar. 17, 2014 (KR) .......................... 10-2014-0030948
Mar. 17, 2014 (KR) .......................... 10-2014-0031310

(51) Int. Cl.
*G01R 11/32* (2006.01)
*G01R 35/00* (2006.01)
*G01R 19/00* (2006.01)
*G05B 9/03* (2006.01)

(52) U.S. Cl.
CPC ........... *G01R 35/005* (2013.01); *G01R 19/00* (2013.01); *G05B 9/03* (2013.01); *G01R 19/0038* (2013.01)

(58) Field of Classification Search
CPC ........ G05B 9/03; H02J 9/00; H02J 9/02–9/06
USPC .................................................. 324/679, 74
See application file for complete search history.

(56) References Cited

U.S. PATENT DOCUMENTS

| | | | |
|---|---|---|---|
| 4,105,900 A | 8/1978 | Martin et al. | |
| 4,276,648 A | 6/1981 | Tomlinson | |
| 5,235,527 A * | 8/1993 | Ogawa | F02D 41/222 340/653 |
| 5,789,925 A * | 8/1998 | Yokotani | G01D 3/08 318/563 |
| 7,443,139 B2 * | 10/2008 | Mitsui | G01R 31/3624 320/132 |

(Continued)

FOREIGN PATENT DOCUMENTS

| | | |
|---|---|---|
| JP | 05-056561 | 3/1993 |
| JP | 11-175875 | 7/1999 |

(Continued)

OTHER PUBLICATIONS

European Patent Office Application Serial No. 15159007.2, Search Report dated Aug. 27, 2015, 8 pages.

(Continued)

*Primary Examiner* — Patrick Assouad
*Assistant Examiner* — Demetrius Pretlow
(74) *Attorney, Agent, or Firm* — Lee, Hong, Degerman, Kang & Waimey

(57) ABSTRACT

A duplex system measuring and outputting at least one of a voltage and current is provided. A first measurement device measures at least one of the voltage and current. A second measurement device measures at least one of the voltage and current. A control device is disconnected from the first measurement device and performs a changeover to the second measurement device when the first measurement device abnormally operates. A filter filters a second measurement value of the second measurement device based on a first measurement value of the first measurement device to output a filtered value.

18 Claims, 12 Drawing Sheets

(56) References Cited

U.S. PATENT DOCUMENTS

| | | | |
|---|---|---|---|
| 2004/0007207 A1* | 1/2004 | Pursifull | G05B 9/03 123/399 |
| 2010/0145634 A1* | 6/2010 | Pinguet | G01F 1/46 702/45 |
| 2014/0100816 A1* | 4/2014 | Rogoff | G01D 3/08 702/176 |
| 2014/0257729 A1* | 9/2014 | Wolf | G01D 4/004 702/89 |

FOREIGN PATENT DOCUMENTS

| | | |
|---|---|---|
| JP | 2000-112502 | 4/2000 |
| KR | 10-2011-0095983 | 8/2011 |
| KR | 10-1144217 | 5/2012 |
| KR | 10-1302572 | 9/2013 |
| WO | 2013/151792 | 10/2013 |

OTHER PUBLICATIONS

Japan Patent Office Application Serial No. 2015-051838, Office Action dated Jan. 19, 2016, 3 pages.

\* cited by examiner

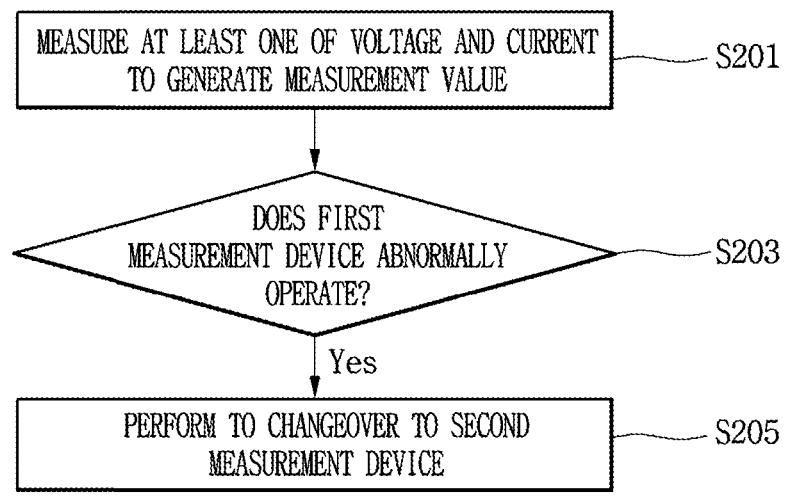
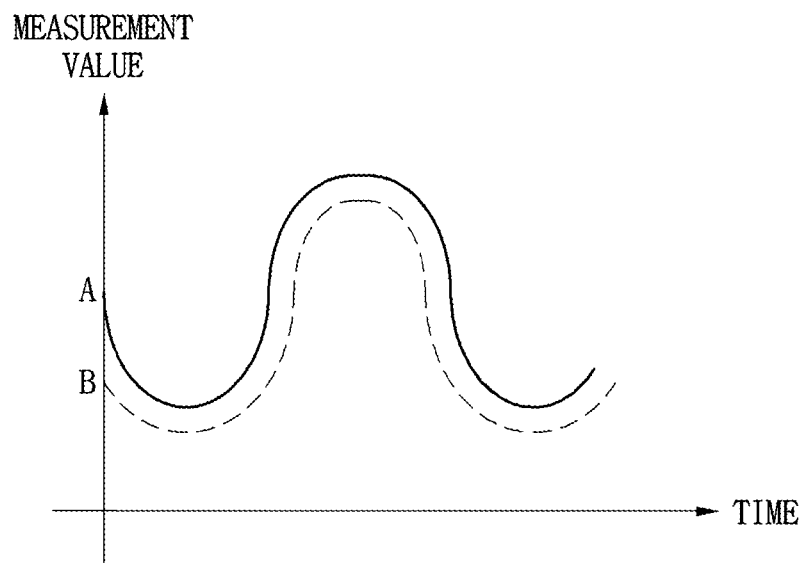

DUPLEX SYSTEM

CROSS-REFERENCE TO RELATED APPLICATIONS

Pursuant to 35 U.S.C. §119(a), this application claims the benefit of earlier filing date and right of priority to Korean Patent Application Nos. 10-2014-0030948 and 10-2014-0031310, filed on Mar. 17, 2014, the contents of which are all hereby incorporated by reference herein in their entirety.

BACKGROUND

The present disclosure relates to a duplex system, and more particularly, to a duplex system that includes a meter measuring a current and voltage.

A duplex system indicates providing and utilizing two components having the same function in order to enhance the reliability of a system. The duplex system includes a spare device for each component so that the entire system does not need to stop when a component in a system abnormally operates. When any one of components in a duplex system has a trouble, the duplex system immediately performs a changeover to a spare device to resume the operation of the duplex system. The duplex system is costly but being widely utilized in a system that needs high reliability and cannot stop its operation.

Such a duplex system is also used in high voltage direct current (HVDC) transmission. The HVDC transmission is one of electricity transmission techniques. The HVDC transmission converts high-voltage alternating current power generated at a power station to highly-efficient high-voltage direct current power by using a power converter into transmit the highly-efficient high-voltage direct current power. According to the HVDC transmission, the direct current power is then re-converted into the alternating current power through the power converter in a desired region. The HVDC transmission is advantageous to long-distance transmission because the amount of power loss is less in comparison to high voltage alternating current transmission.

An HVDC transmission device performing such HVDC transmission uses an inverter converting direct current power into alternating current power and a converter converting the alternating current power into the direct current power. A meter measuring a current and voltage for the control of the inverter and the converter measures the current and voltage at a point of each device of a system and grid to which the HVDC transmission is applied. The HVDC transmission needs high reliability. Thus, the meter measuring the current and voltage includes a duplex system. When the meter normally operates and changes over, there is a risk that there is a shock to the duplex system or the entire system normally operates. Thus, there is a need for a duplex system for preventing the shock or abnormal operation.

SUMMARY

Embodiments provide a duplex system that may minimize the shock of a duplex system when a changeover is performed due to the abnormal operation of a system component. In particular, embodiments provide a duplex system that may minimize a shock to a duplex system when a meter measuring a current and voltage normally operates and thus a changeover is performed.

In one embodiment, a duplex system measuring and outputting at least one of a voltage and current includes: a first measurement device measuring at least one of the voltage and current; a second measurement device measuring at least one of the voltage and current; a control device disconnected from the first measurement device and performing a changeover to the second measurement device when the first measurement device abnormally operates; and a filter filtering a second measurement value of the second measurement device based on a first measurement value of the first measurement device to output a filtered value.

The control device establishes a connection to the filter before the control device is disconnected from the first measurement device and performs a changeover to the second measurement device, when the first measurement device abnormally operates.

The control device may be disconnected from the filter, when a preset time after the connection to the filter is established elapses.

The filter may include at least one of a low pass filter, a linear filter, and an interpolation filter.

The control device may determine that the first measurement device abnormally operates, when the first measurement value of the first measurement device is a value having a difference to a previous measurement value of the first measurement device equal to or larger than a preset reference value.

The duplex system may further include: a first buffer buffering the first measurement value of the first measurement device; and a second buffer buffering the second measurement value of the second measurement device, wherein the control device outputs a measurement value of the second measurement device based on the first measurement value buffered and the second measurement device buffered.

The duplex system may further include an offset calculation unit calculating a time offset being a difference in time between the first measurement value buffered and the second measurement value buffered, wherein the control device outputs a measurement value of the second measurement device based on the time offset.

The control device may correct the measurement value of the second measurement device by the time offset to output a corrected early measurement value, when the first measurement value buffered is earlier than the second measurement value.

The control device may correct the measurement value of the second measurement device by the time offset to output a corrected late measurement value, when the first measurement value buffered is later than the second measurement value.

In another embodiment, a method of operating a duplex system measuring and outputting at least one of a voltage and current includes: measuring at least one of the voltage and current by a first measurement device and a second measurement device; disconnecting from the first measurement device and performing a changeover to the second measurement device when the first measurement device abnormally operates; and filtering a second measurement value of the second measurement device based on a first measurement value of the first measurement device to output a filtered value.

The details of one or more embodiments are set forth in the accompanying drawings and the description below. Other features will be apparent from the description and drawings, and from the claims.

BRIEF DESCRIPTION OF THE DRAWINGS

FIG. 4 is a flowchart of how a measurement unit to which a duplex system according to an embodiment is applied operates.

FIG. 5 shows measurement values of a first measurement device and a second measurement device that a measurement unit according to an embodiment includes.

DETAILED DESCRIPTION OF THE EMBODIMENTS

Figure 1:
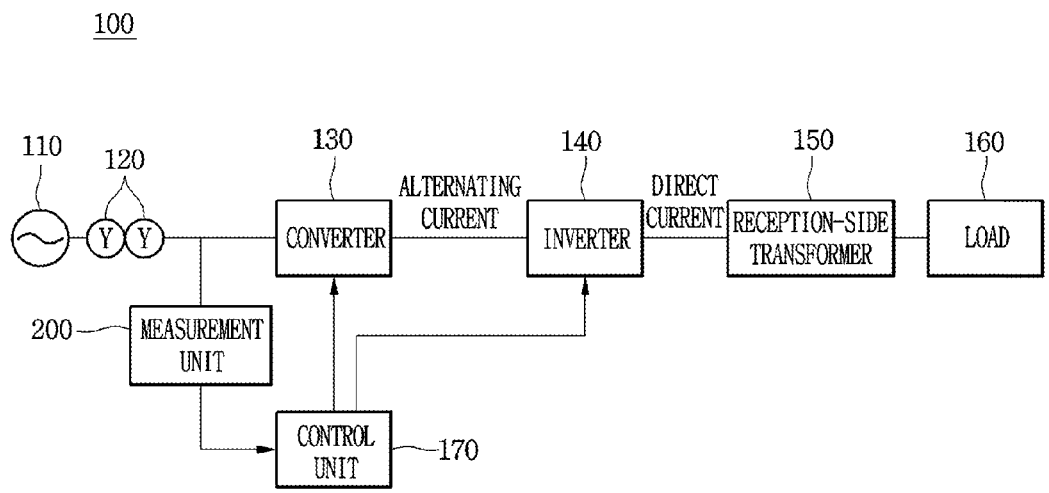
FIG. 1 shows a high voltage direct current (HVDC) transmission system to which a duplex system according to an embodiment may be applied.

Embodiments are described below in detail with reference to the accompanying drawings so that a person skilled in the art may easily practice the embodiments. However, the present invention may be implemented in many different forms and is not limited to embodiments that are described herein. In addition, parts irrelevant to descriptions are not provided in the drawings in order to make the present invention clear and similar parts throughout the disclosure have similar reference numerals.

Also, when it is described that a part includes some elements, it should be understood that it may not exclude but further include other elements if there is no specific description contrary thereto.

FIG. 1 shows a high voltage direct current (HVDC) transmission system to which a duplex system according to an embodiment may be applied.

The HVDC transmission system includes an alternating current power source 110, a transmission-side transformer 120, a converter 130, an inverter 140, a reception-side transformer 150, a load 160, a control unit 170, and a measurement unit 200.

The alternating current power source 110 generates alternating current power.

The transmission-side transformer 120 raises the voltage of generated alternating current power. In this case, as the transmission-side transformer 120 raises the voltage, it is possible to enhance the efficiency of power transmission.

The converter 130 converts alternating current power into high voltage or extra-high voltage direct current power to transmit the extra-high voltage direct current power. The converter 130 may include a thyristor valve and rectifier. In this case, as the converter 130 converts alternating current power into high voltage or extra-high voltage direct current power, it is possible to enhance the efficiency of power transmission.

The inverter 140 converts direct current power into alternating current power.

The reception-side transformer 150 converts the voltage of the alternating current power into a rated voltage used for the load 160 to supply alternating current obtained through conversion power to the load 160.

The measurement unit 200 measures at least one of a voltage and current in the HVDC transmission system 100. The measurement unit 200 in the embodiment according to FIG. 1 may measure converted alternating current power by the transmission-side transformer 120 without a limitation and the measurement unit 200 may measure other parts in the HVDC transmission system 100. The measurement unit 200 may be a duplex system that includes a plurality of measurement devices for the stability and reliability of a system. Related descriptions are provided in detail with reference FIGS. 3 to 9.

The control unit 170 controls the operations of the converter 130 and the inverter 140 based on a measurement value obtained by measuring at least one of a voltage and current.

Figure 2:
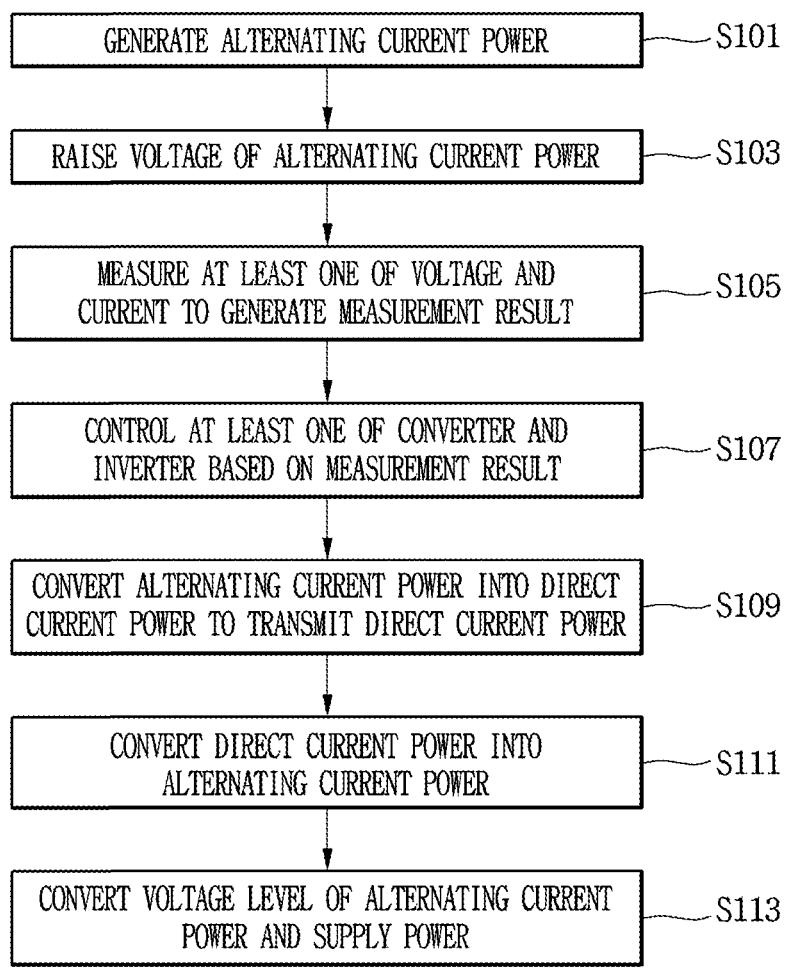
FIG. 2 is a flowchart of how a high voltage direct current (HVDC) transmission system to which a duplex system according to an embodiment may be applied operates.

FIG. 2 is a flowchart of how a high voltage direct current (HVDC) transmission system to which a duplex system according to an embodiment may be applied operates.

The alternating current power source 110 generates alternating current power in step S101.

The transmission-side transformer 120 raises the voltage of generated alternating current power in step S103. The transmission-side transformer 120 may enhance the efficiency of power transmission by raising the voltage of alternating current power.

The measurement unit 200 measures at least one of a voltage and current in the HVDC transmission system 100 to generate a measurement result in step S105.

The control unit 170 controls at least one of the converter 130 and the inverter 140 based on the measurement result in step S107.

The converter 130 converts alternating current power into extra-high voltage or high voltage direct current power to transmit the extra-high voltage or high voltage direct current power in step S109. It is possible to enhance the efficiency of power transmission by converting alternating current power into the extra-high voltage or high voltage direct current power and transmitting the extra-high voltage or high voltage direct current power.

The inverter 140 converts direct current power into alternating current power in step S111.

The reception-side transformer 150 converts the voltage of the alternating current power into a rated voltage used for the load 160 to supply alternating current obtained through conversion power to the load 160 in step S113.

Figure 3:
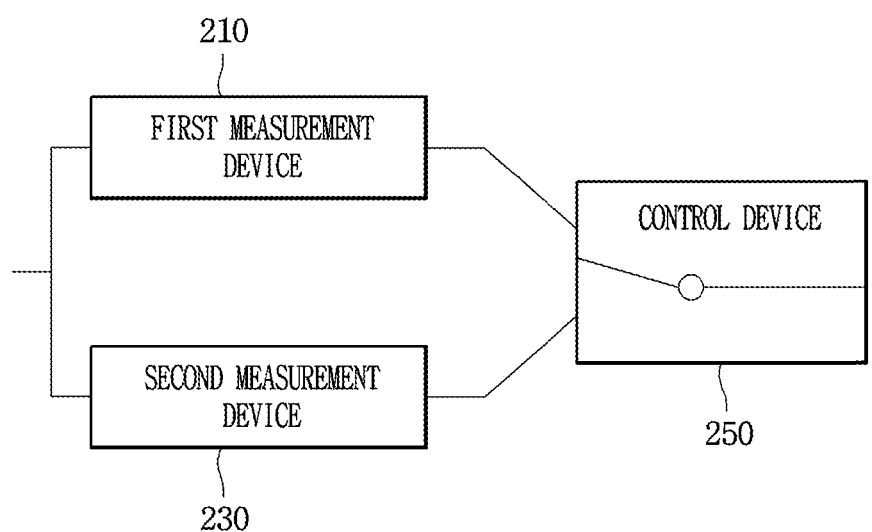
FIG. 3 is a block diagram of a measurement unit to which a duplex system according to an embodiment is applied.

FIG. 3 is a block diagram of a measurement unit to which a duplex system according to an embodiment may be applied.

The measurement unit 200 includes a first measurement device 210, a second measurement device 230, and a control device 250. In this case, the measurement device that the measurement unit 200 includes is not limited to the first measurement device 210 and the second measurement device 230.

The first measurement device 210 and the second measurement device 230 measure at least one of a voltage and current to generate a measurement value.

The control device 250 changes over to the second measurement device 230 when the first measurement device 210 being currently used abnormally operates. In particular, the control device 250 may be disconnected from the first measurement device 210 being currently used, and connected to the second measurement device 230 to generate a measurement value. In this case, the control device 250 may include a switch and the control device 250 may use the switch to be disconnected from the first measurement device 210 and establish a connection to the second measurement device 230. When the first measurement device 210 being currently used measures a value having a difference to a previous measurement value equal to or larger than a predefined reference value or stops measuring, the control device 250 may determine that the first measurement device 210 abnormally operates. For example, when the first measurement device 210 performs measurement and then stops measuring, the control device 250 may be disconnected from the first measurement device 210 and establish a connection to the second measurement device 230 to generate a measurement value. The reason is to enhance the stability and reliability of the measurement unit as described earlier. Accordingly, the measurement unit 200 may normally operate even if any one of a plurality of measurement devices abnormally operates.

FIG. 4 is a flowchart of how a measurement unit to which a duplex system according to an embodiment is applied operates.

The first measurement device 210 and the second measurement device 230 measure at least one of a voltage and current to generate a measurement value in step S201.

The control device 250 determines whether the first measurement device 210 abnormally operates in step S203. In particular, when the first measurement device 210 measures a value having a difference to a previous measurement value equal to or larger than a predefined reference value or stops measuring, the control device 250 may determine that the first measurement device 210 abnormally operates.

When the first measurement device 210 abnormally operates, the control device 250 changes over to the second measurement device 230 in step S205.

However, by a difference between measurement values of the first measurement device 210 and the second measurement device 230 when a changeover is performed, the control unit 170 controlling the operations of the converter 130 and the inverter 140 based on a measurement value of the measurement unit 200 may abnormally operate. Related descriptions are provided in detail with reference FIGS. 5 to 6.

FIG. 5 shows measurement values of a first measurement device and a second measurement device that a measurement unit according to an embodiment includes.

Figure 6:
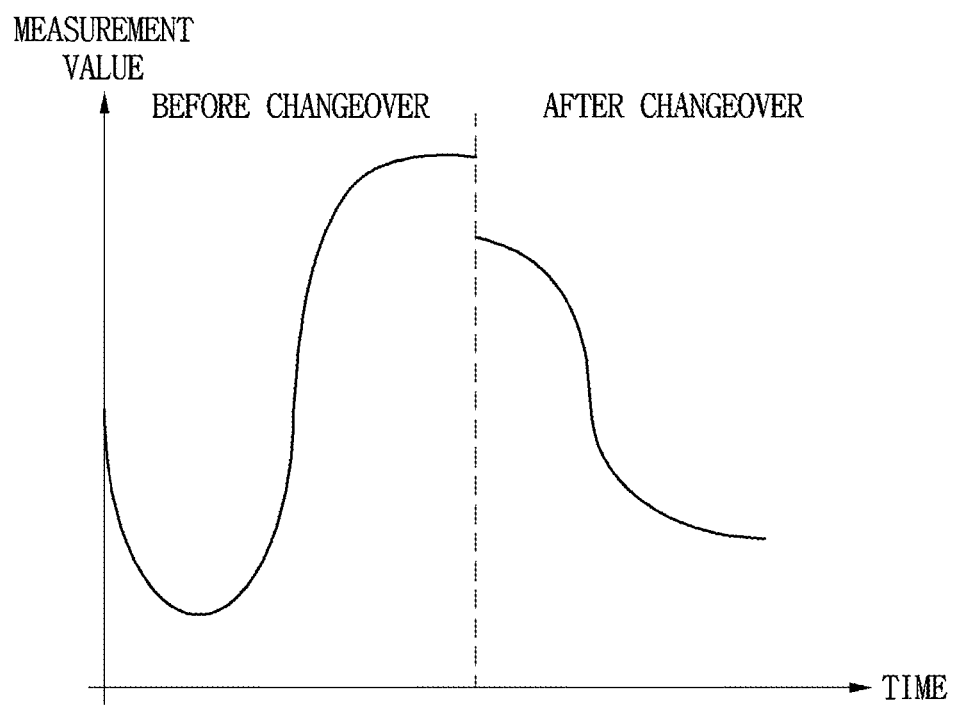
FIG. 6 shows output values of a measurement unit when a control device of a duplex system according to an embodiment performs a changeover.

FIG. 6 shows output values of a measurement unit when a duplex system according to an embodiment performs a changeover.

Manufacturers of the control unit 170, the first measurement device 210, and the second measurement device 230 may be different from one another. Also, even if the first measurement device 210 and the second measurement device 230 are products from the same manufacturer, the devices may be different in model. In this case, even when the same point is measured at the same time, there may be a big difference between the output values of the first measurement device 210 and the second measurement device 230. Also, even when the first measurement device 210 and the second measurement device 230 are the same model from the same manufacturer, there may be a difference between output values because the first measurement device 210 and the second measurement device 230 operate independently. Curve A in FIG. 5 is formed by using measurement values measured by the first measurement device 210 and curve B in FIG. 5 is formed by using measurement values measured by the second measurement device 230. In the embodiment according to FIG. 5, curves A and B show a uniform difference in size. In this case, when a changeover is performed between the first measurement device 210 and the second measurement device 230, measurement values output by the measurement unit 200 have a discontinuous point as shown in FIG. 6. Thus, when a changeover is performed between the first measurement device 210 and the second measurement device 230, a measurement value output by the measurement unit 250 rapidly changes. When the measurement value rapidly changes, the control unit 170 controlling the operations of the converter 130 and the inverter 140 based on the measurement value may abnormally operate. Therefore, there is a need for a duplex system that may prevent it.

Figure 7:
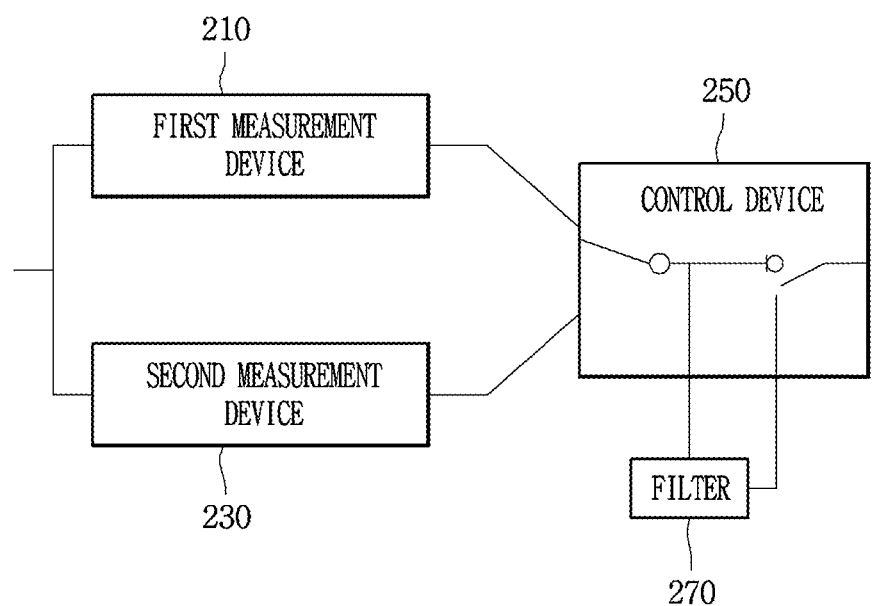
FIG. 7 is a block diagram of a measurement unit to which a duplex system according to another embodiment is applied.

FIG. 7 is a block diagram of a measurement unit to which a duplex system according to another embodiment is applied.

The measurement unit 200 includes the first measurement device 210, the second measurement device 230, the control device 250, and a filter 270. The measurement unit 200 in FIG. 7 is the same as to the measurement unit 200 in the embodiment according to FIG. 3 in most components but has a difference in that it includes the filter 270.

The control device 250 changes over to the second measurement device 230 when the first measurement device 210 being currently used abnormally operates. In particular, the control device 250 may be disconnected from the first measurement device 210 being currently used, and connected to the second measurement device 230 to generate a measurement value. In this case, the control device 250 establishes a connection to the filter 270 before a changeover and inputs a measurement value of the first measurement device 210 into the filter 270. The control device 250 inputs a measurement value of the second measurement device 230 after the changeover and receives a filtered measurement value from the filter 270. After the changeover, the control device 250 may be disconnected from the filter 270 after a preset reference time elapses.

The filter 270 filters a measurement value of the second measurement device 230 based on a measurement value of the first measurement device 210 when a changeover is performed to decrease a difference between a measurement value before the changeover and a measurement value after the changeover that are output by the control device 250. In particular, the filter 270 filters a measurement value of the second measurement device 230 based on a measurement value of the first measurement device 210 to decrease a difference between a measurement value before the changeover and a measurement value after the changeover that are output by the control device 250. In particular, the filter 270 may include at least one of a low pass filter, a linear filter, and an interpolation filter. Accordingly, the filter 270 prevents the discontinuity of measurement values when a changeover is performed. Thus, it is possible to prevent the malfunction of the control unit 170 resulting from a rapid change in a measurement value.

There may be a case where there is a difference in time as well as an difference in size between a measurement value of the first measurement device 210 and a measurement value of the second measurement device 230. In order to prevent it, the measurement unit 200 may include a first buffer (not shown), a second buffer (not shown), and an offset measurement unit (not shown). The first buffer (not shown) buffers a measurement value of the first measurement device 210. In particular, the first buffer (not shown) stores a measurement value of the first measurement device 210 for a certain time. The second buffer (not shown) buffers a measurement value of the second measurement device 230. In particular, the second buffer (not shown) stores a measurement value of the second measurement device 230 for a certain time. An offset calculation unit (not shown) calculates a difference in time between a value buffered in the first buffer (not shown) and a value buffered in the second buffer (not shown) to output an offset that is a difference in time between a measurement value of the first measurement device 210 and a measurement value of the second measurement device 230. The control device 250 may output a measurement value of the second measurement device 230 after a changeover based on a buffered measurement value of the first measurement device and a buffered measurement value of the second measurement device. In particular, the control device 250 may output a measurement value of the second measurement device 230 after the changeover based on an time offset received from the offset calculation unit (not shown). In particular, the control device 250 may correct the measurement value of the second measurement device 230 after the changeover by the time offset received from the offset calculation unit (not shown). When a measurement value of the first measurement device 210 is earlier than a measurement value of the second measurement device 230, the control device 250 may move the measurement value of the second measurement device 230 as early as the time offset. When a measurement value of the first measurement device 210 is later than a measurement value of the second measurement device 230, the control device 250 may move the measurement value of the second measurement device 230 as late as the time offset. Accordingly, the filter 270 prevents the discontinuity of measurement values when a changeover is performed. Thus, it is possible to prevent the malfunction of the control unit 170 resulting from the discontinuity of measurement values.

Figure 8:
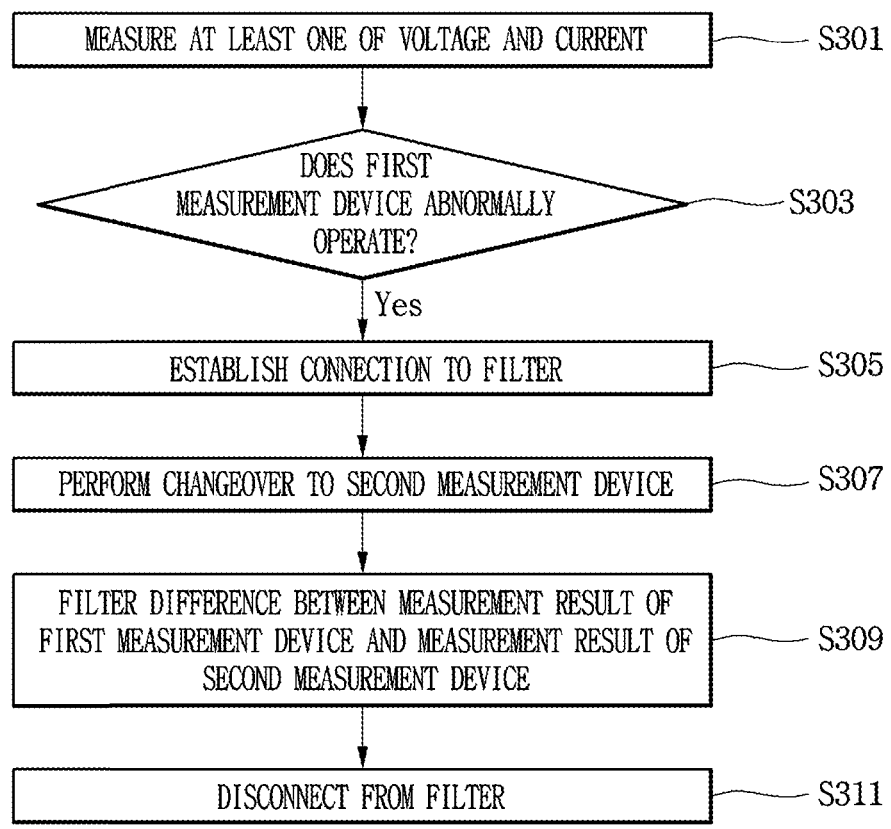
FIG. 8 is a flow chart of how a measurement unit to which a duplex system according to still another embodiment is applied operates.

FIG. 8 is a flow chart of how a measurement unit to which a duplex system according to still another embodiment is applied operates.

The first measurement device 210 and the second measurement device 230 measure at least one of a voltage and current to generate a measurement value in step S301.

The control device 250 determines whether the first measurement device 210 abnormally operates in step S303. In particular, when the first measurement device 210 measures a value having a difference to a previous measurement value equal to or larger than a predefined reference value or stops measuring, the control device 250 may determine that the first measurement device 210 abnormally operates.

When the first measurement device 210 abnormally operates, the control device 250 establishes a connection to the filter 270 in step S305. As the connection to the filter 270 is established, the control device 250 inputs a measurement value of the first measurement device 210 into the filter.

The control device 250 performs a changeover to the second measurement device 230 in step S307. As the changeover to the second measurement device 230 is performed, the control device 250 inputs a measurement value of the second measurement device 250 into the filter.

The filter 270 filters a measurement value of the second measurement device 230 based on a measurement value of the first measurement device 210 when a changeover is performed to decrease a difference between a measurement value before the changeover and a measurement value after the changeover that are output by the control device 250 in step S309. Te filter 270 may include at least one of a low pass filter, a linear filter, and an interpolation filter. Thus, the filter 270 may perform at least one of low-band filtering, linear filtering and interpolation filtering. Accordingly, the filter 270 prevents the discontinuity of measurement values when a changeover is performed. Thus, the filter 270 may prevent the malfunction of the control unit 170 resulting from a rapid change in a measurement value.

The control device 250 is disconnected from the filter 270 in step S311. After a connection is generated and then a preset reference time elapses, the control device 250 may be disconnected from the filter 270. As the connection to the filter 270 is disconnected, the control device 250 outputs a measurement value of the first measurement device 230 by not using the filter. The reason is to prevent deformation appearing when the measurement value of the second measurement device 230 uses the filter. The reason is also to prevent an output of a measurement value by the control device 250 from becoming delayed due to the filter.

Figure 9:
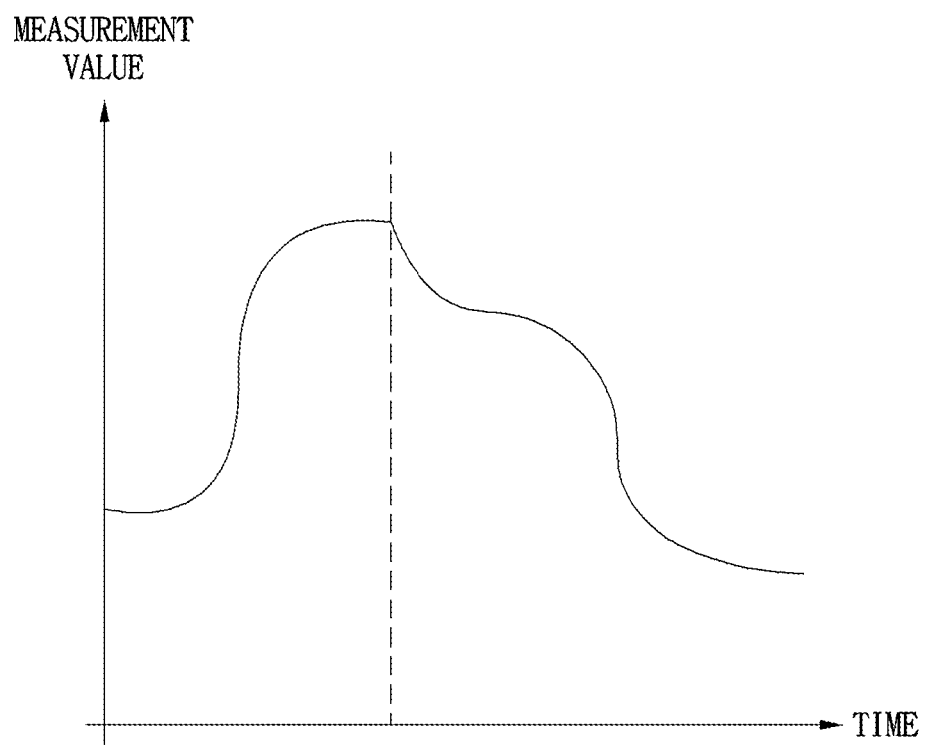
FIG. 9 shows output values of a measurement unit when a duplex system according to still another embodiment performs a changeover.

FIG. 9 shows output values of a measurement unit when a duplex system according to still another embodiment performs a changeover.

The output values of the measurement unit 250 as shown in FIG. 9 do not experience discontinuity between before and after the changeover unlike those in FIG. 6. As described earlier, the reason is because the filter 270 filters a measurement value of the second measurement device 230 based on a measurement value of the first measurement device 210 when a changeover is performed to decrease a difference between a measurement value before the changeover and a measurement value after the changeover that are output by the control device 250. Thus, it is possible to prevent the output values of the measurement unit 200 from experiencing discontinuity.

Figure 10:
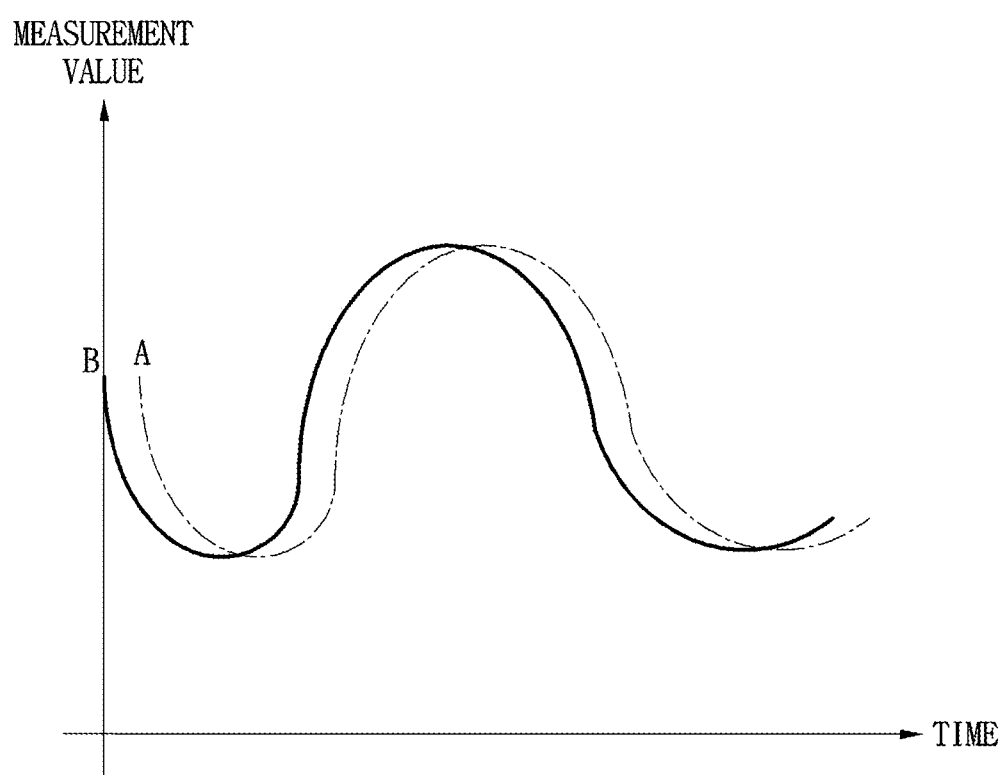
FIG. 10 shows measurement values of a first measurement device and a second measurement device that a measurement unit according to an embodiment includes.

FIG. 10 shows measurement values of a first measurement device and a second measurement device that a measurement unit according to an embodiment includes.

Figure 11:
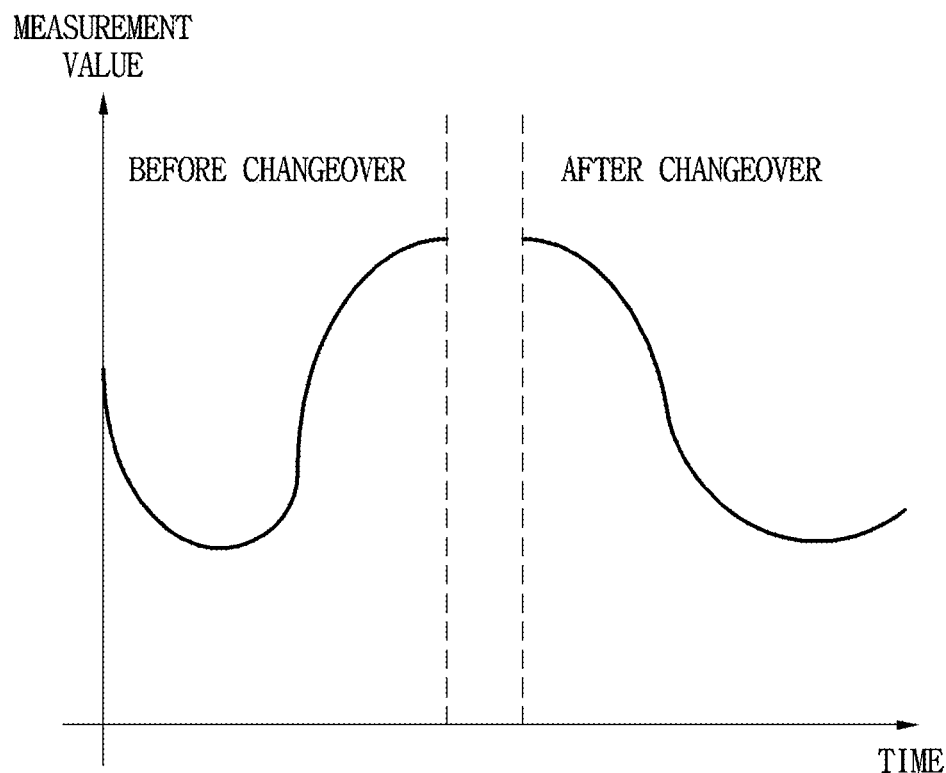
FIG. 11 shows output values of a measurement unit when a control device of a duplex system according to an embodiment performs a changeover.

FIG. 11 shows output values of a measurement unit when a duplex system according to an embodiment performs a changeover.

Since the first measurement device 210 and the second measurement device 230 operate independently when the same point is measured at the same time, the output values of the first measurement device 210 and the second measurement device 230 may have a difference in time according to the hardware characteristic of a device. Also, even if the first measurement device 210 and the second measurement device 230 are products from the same manufacturer, the devices may be different in product model. Thus, the measurement values of the first measurement device 210 and the second measurement device may have a difference in time. In this case, there is a gap between the measurement values. In particular, when the control device 250 is disconnected from the first measurement device 210 and establishes a connection to the second measurement device 230, there is a gap between measurement values output by the measurement unit 200. Curve A in FIG. 10 is formed by using measurement values measured by the first measurement device 210 and curve B in FIG. 10 is formed by using measurement values measured by the second measurement device 230. In the embodiment according to FIG. 10, the first measurement device 210 and the second measurement device 230 output the same measurement value at a certain time interval. In the embodiment according to FIG. 10, the first measurement device 210 generates a measurement value a bit earlier than the second measurement device 230. Thus, when a changeover is performed between the first measurement device 210 and the second measurement device 230, measurement values output by the measurement unit 200 may have a gap as shown in FIG. 6. Thus, the control unit 170 controlling the operations of the converter 130 and the inverter 140 based on the measurement value may abnormally operate. Therefore, there is a need for a duplex system that may prevent it.

Figure 12:
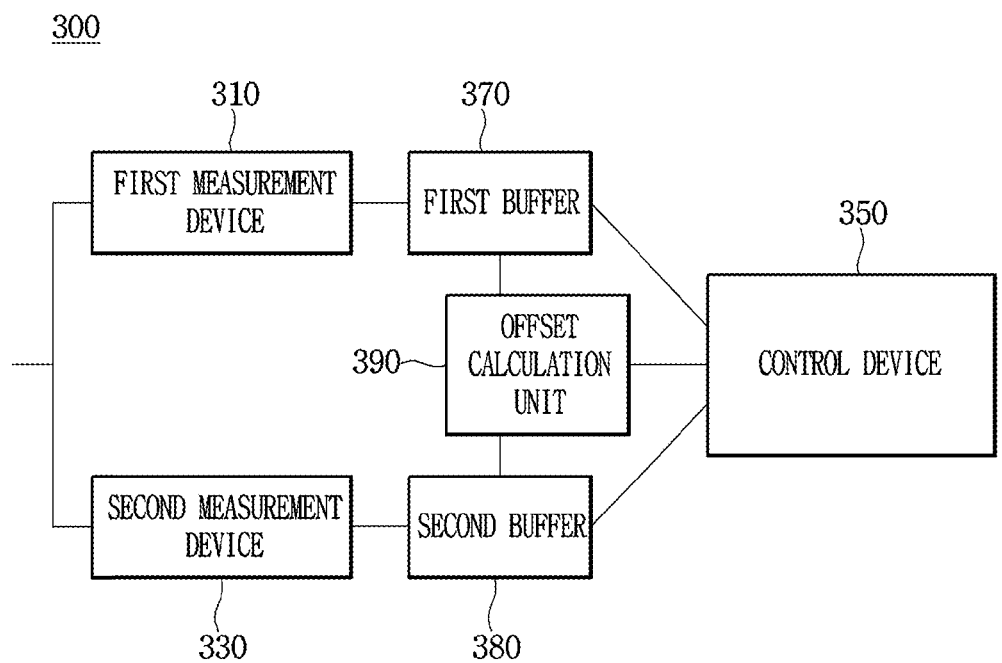
FIG. 12 is a block diagram of a measurement unit to which a duplex system according to another embodiment is applied.

FIG. 12 is a block diagram of a measurement unit to which a duplex system according to another embodiment is applied.

A measurement unit 300 includes the first measurement device 310, the second measurement device 330, the control device 350, a first buffer 370, a second buffer 380 and an offset calculation unit 390. The measurement unit 300 in FIG. 12 is the same as the measurement unit 200 in the embodiment according to FIG. 3 in most components but has a difference in that it includes the first buffer 370, the second buffer 380, and the offset calculation unit 390.

The first buffer 370 buffers a measurement value of the first measurement device 310. In particular, the first buffer 370 stores a measurement value of the first measurement device 310 for a certain time.

The second buffer 380 buffers a measurement value of the second measurement device 330. In particular, the second buffer (380) stores a measurement value of the second measurement device 330 for a certain time.

The offset calculation unit 390 calculates a difference in time between a value buffered in the first buffer 370 and a value buffered in the second buffer 380 to output an offset that is a difference in time between a measurement value of the first measurement device 310 and a measurement value of the second measurement device 330.

The control device 350 changes over to the second measurement device 330 when the first measurement device 310 being currently used abnormally operates. In particular, the control device 350 may be disconnected from the first measurement device 310 being currently used, and connected to the second measurement device 330 to generate a measurement value. The control device 350 may output a measurement value of the second measurement device 330 after a changeover based on a buffered measurement value of the first measurement device and a buffered measurement value of the second measurement device. In particular, the control device 350 may output a measurement value of the second measurement device 330 after the changeover based on a time offset received from the offset calculation unit 390. In particular, the control device 350 may correct the measurement value of the second measurement device 330 after the changeover by the time offset received from the offset calculation unit 390. When a measurement value of the first measurement device 310 is earlier than a measurement value of the second measurement device 330, the control device 350 may move the measurement value of the second measurement device 330 as early as the time offset. When a measurement value of the first measurement device 310 is later than a measurement value of the second measurement device 330, the control device 350 may move the measurement value of the second measurement device 330 as late as the time offset. Accordingly, the control device 350 prevents the gap between measurement values when a changeover is performed. Thus, it is possible to prevent the malfunction of the control unit 170 resulting from the gap between measurement values.

Also, there may be a case where there is a difference in size between measurement values as well as an difference in time as described earlier. When there is the difference in size between measurement values, there may be the discontinuity of measurement values when a changeover is performed. In order to prevent it, the measurement unit 300 may further include a filter (not shown). The filter (not shown) filters a measurement value of the second measurement device 330 based on a measurement value of the first measurement device 310 when a changeover is performed to decrease a difference between a measurement value before the changeover and a measurement value after the changeover that are output by the control device 350. The filter (not shown) may include at least one of a low pass filter, a linear filter, and an interpolation filter. Thus, the filter (not shown) may perform at least one of low-band filtering, linear filtering and interpolation filtering. Accordingly, the filter (not shown) prevents the discontinuity of measurement values when a changeover is performed. Thus, the filter 270 may prevent the malfunction of the control unit 170 resulting from a rapid change in a measurement value. In this case, the control device 350 may establish a connection to the filter (not shown) before a changeover and input a measurement value of the first measurement device 310 into the filter (not shown). The control device 350 inputs a measurement value of the second measurement device 330 after the changeover and receives a filtered measurement value from the filter (not shown). After the changeover, the control device 350 may be disconnected from the filter (not shown) after a preset reference time elapses. Thus, the measurement unit 300 to be described in FIGS. 12 to 14 may include all components of the measurement unit 200 as described in FIGS. 7 to 9 and equally perform the operations of the measurement unit 200.

Figure 13:
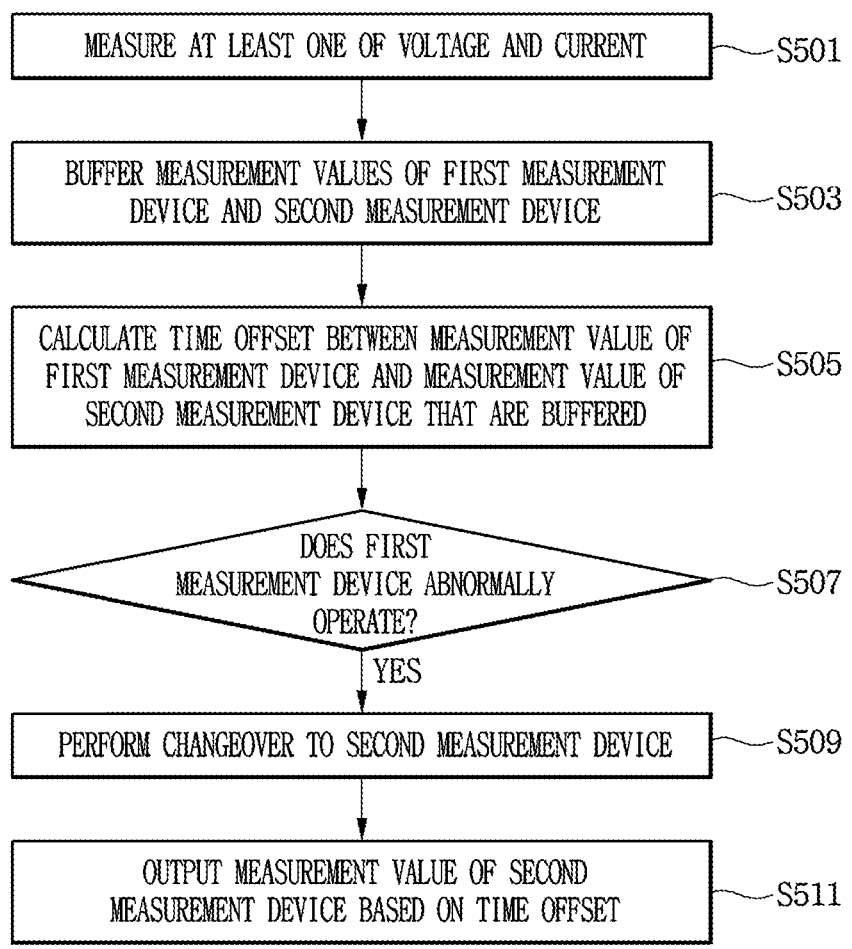
FIG. 13 is a flow chart of how a measurement unit to which a duplex system according to still another embodiment is applied operates.

FIG. 13 is a flow chart of how a measurement unit to which a duplex system according to still another embodiment is applied operates.

The first measurement device 310 and the second measurement device 330 measure at least one of a voltage and current to generate a measurement value in step S501.

The first buffer 370 buffers a measurement value of the first measurement device 310 and the second buffer 380 buffers a measurement value of the second measurement device 330 in step S503. In particular, the first buffer 370 may store a measurement value of the first measurement device 310 for a certain time and the second buffer 380 may store a measurement value of the second measurement device 330 for a certain time.

The offset calculation unit 390 calculates a time offset that is a difference in time between a buffered measurement value of the first measurement device 310 and a measurement value of the second measurement device in step S505.

The control device 350 determines whether the first measurement device 310 abnormally operates in step S507. In particular, when the first measurement device 310 measures a value having a difference to a previous measurement value equal to or larger than a predefined reference value or stops measuring, the control device 350 may determine that the first measurement device 310 abnormally operates.

When the first measurement device 310 abnormally operates, the control device 350 changes over to the second measurement device 330 in step S509. In particular, when the first measurement device 310 abnormally operates, the control unit 350 may perform a changeover to the second measurement device 330. In particular, the control device 350 may be disconnected from the first measurement device 310 being currently used, and connected to the second measurement device 330 to generate a measurement value.

The control device 350 outputs a measurement value of the second measurement device 330 based on the time offset in step S511. In particular, the control device 350 may correct the measurement value of the second measurement device 330 after the changeover by the time offset received from the offset calculation unit 390. When a measurement value of the first measurement device 310 is earlier than a measurement value of the second measurement device 330, the control device 350 may move the measurement value of the second measurement device 330 as early as the time offset. When a measurement value of the first measurement device 310 is later than a measurement value of the second measurement device 330, the control device 350 may move the measurement value of the second measurement device 330 as late as the time offset. Accordingly, the filter 270 prevents the discontinuity of measurement values when a changeover is performed. Thus, it is possible to prevent the malfunction of the control unit 170 resulting from a rapid change in a measurement value.

Figure 14:
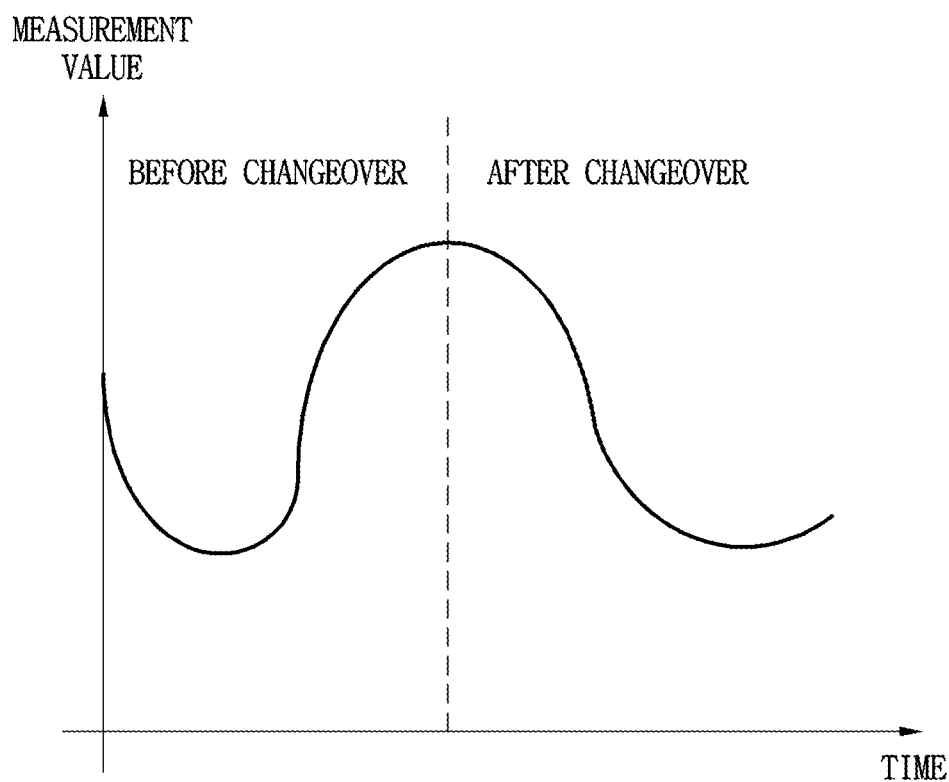
FIG. 14 shows output values of a measurement unit when a duplex system according to still another embodiment performs a changeover.

FIG. 14 shows output values of a measurement unit when a duplex system according to still another embodiment performs a changeover.

The output values of the measurement unit 250 as shown in FIG. 14 do not experience a gap between before and after the changeover unlike those in FIG. 11. As described earlier, the control device 350 outputs the measurement value of the second measurement device 330 based on a time offset related to a buffered measurement value of the first measurement device 310 and a measurement value of the second measurement device 330 when a changeover is performed. Thus, a difference in time between a measurement value before the changeover and a measurement value after the changeover that are output by the measurement unit 300 may be corrected. Thus, it is possible to prevent the output values of the measurement unit 300 from experiencing a gap.

The characteristics, structures, and effects described in the embodiments above are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a variation are included in the scope of embodiments.

Embodiments are mostly described above. However, they are only examples and do not limit the present invention. A person skilled in the art may appreciate that many variations and applications not presented above may be implemented without departing from the essential characteristic of embodiments. For example, each component particularly represented in embodiments may be varied. In addition, it should be construed that differences related to such a variation and such an application are included in the scope of the present invention defined in the following claims.

A duplex system according to an embodiment provides a duplex system that may minimize a shock to the duplex system when a changeover is performed due to an abnormal operation of a system component. In particular, it is possible to provide a duplex system that may minimize a shock to a duplex system due to a changeover when a measurement device measuring a current and voltage normally operates and thus there is the changeover.

Also, although embodiments which are applied to the HVDC transmission system are described in order to particularly describe the duplex system of the present invention, the present invention is not limited thereto and the duplex system of the present invention may be used for other systems.

What is claimed is:

1. A duplex system measuring and outputting at least voltage or current, the duplex system comprising:
a first measurement device measuring at least the voltage or current to generate a first measurement value;
a second measurement device measuring at least the voltage or current to generate a second measurement value;
a control device outputting the first measurement value or the second measurement value, the control device disconnected from the first measurement device and performing a changeover from the first measurement device to the second measurement device when a difference between a present first measurement value and a previous first measurement value is equal to or greater than a predefined reference value or the first measurement device stops measuring voltage or current values; and
a filter filtering the second measurement value based on the first measurement value to decrease a difference between the first measurement value or second measurement value output by the control device before the changeover and the first measurement value or second measurement value output by the control device after the changeover.

2. A duplex system measuring and outputting at least voltage or current, the duplex system comprising:
a first measurement device measuring at least the voltage or current to generate a first measurement value;
a second measurement device measuring at least the voltage or current to generate a second measurement value;
a control device disconnected from the first measurement device and performing a changeover to the second measurement device when the first measurement device abnormally operates; and
a filter filtering the second measurement value based on the first measurement value,
wherein the control device establishes a connection to the filter before the control device is disconnected from the first measurement device and the changeover to the second measurement device is performed.

3. The duplex system according to claim 2, wherein the control device is disconnected from the filter a preset time after the connection to the filter is established.

4. The duplex system according to claim 2, wherein the filter comprises at least a low pass filter, a linear filter or an interpolation filter.

5. The duplex system according to claim 2, wherein the control device determines that the first measurement device abnormally operates when a difference between a present first measurement value and a previous first measurement value is equal to or greater than a preset reference value.

6. The duplex system according to claim 2, further comprising:
a first buffer buffering the first measurement value to generate a first buffered value; and
a second buffer buffering the second measurement value to generate a second buffered value, wherein the control device outputs the second measurement value based on the first buffered value and the second buffered value.

7. The duplex system according to claim 6, further comprising an offset calculation unit calculating a time offset that is a difference in time between the first buffered value buffered and the second buffered value,
wherein the control device outputs the second measurement value based on the calculated time offset.

8. The duplex system according to claim 7, wherein the control device corrects the second measurement value according to the time offset to output a corrected early measurement value when the first buffered value is earlier than the second measurement value.

9. The duplex system according to claim 7, wherein the control device corrects the second measurement value according to the time offset to output a corrected late measurement value when the first buffered value is later than the second measurement value.

10. A method of operating a duplex system measuring and outputting at least voltage or current, the method comprising:
measuring at least the voltage or current by a first measurement device to generate a first measurement value;
measuring at least the voltage or current by a second measurement device to generate a second measurement value;
outputting the first measurement value or the second measurement value;
disconnecting from the first measurement device and performing a changeover from the first measurement device to the second measurement device when a difference between a present first measurement value and a previous first measurement value is equal to or greater than a predefined reference value or the first measurement device stops measuring voltage or current values; and
filtering the second measurement value based on the first measurement value to decrease a difference between the first measurement value or second measurement value output before the changeover and the first measurement value or second measurement value output after the changeover.

11. A method of operating a duplex system measuring and outputting at least voltage or current, the duplex method comprising:
measuring at least voltage or current by a first measurement device to generate a first measurement value;
measuring at least the voltage or current by a second measurement device to generate a second measurement value;
establishing a connection to a filter when the first measurement device abnormally operates;
filtering the second measurement value of based on the first measurement value;
disconnecting from the first measurement device and performing a changeover to the second measurement device.

12. The method according to claim 11, further comprising disconnecting from the filter a preset time after the connection to the filter is established.

13. The method according to claim 11, wherein the filter comprises at least a low pass filter, a linear filter or an interpolation filter.

14. The method according to claim 11, wherein disconnecting from the first measurement device and performing the changeover to the second measurement device comprises determining that the first measurement device abnormally operates when a difference between a present first measurement value and a previous first measurement value is equal to or greater than a preset reference value.

15. The method according to claim 11, further comprising:
buffering the first measurement value to generate a first buffered value; and
buffering the second measurement value to generate a second buffered value,
wherein filtering the second measurement value comprises outputting the second measurement value based on the first buffered value and the second buffered value.

16. The method according to claim 15, wherein outputting the second measurement value based on the first buffered value and the second buffered value comprises:
calculating a time offset that is a difference in time between the first buffered value and the second buffered value; and
outputting the second measurement value based on the calculated time offset.

17. The method according to claim 16, wherein outputting the second measurement value based on the calculated time offset comprises correcting the second measurement value according to the time offset to output a corrected early measurement value when the first buffered value is earlier than the second measurement value.

18. The method according to claim 16, wherein outputting the second measurement value based on the first buffered value and the second buffered value comprises correcting the second measurement value according to the time offset to output a corrected late measurement value when the first buffered value is later than the second measurement value.

* * * * *